(12) United States Patent
He et al.

(10) Patent No.: US 7,852,189 B2
(45) Date of Patent: Dec. 14, 2010

(54) PACKAGED SPIRAL INDUCTOR STRUCTURES, PROCESSES OF MAKING SAME, AND SYSTEMS CONTAINING SAME

(75) Inventors: Jiangqi He, Gilbert, AZ (US); Robert L. Sankman, Phoenix, AZ (US); BaoShu Xu, Shanghai (CN); Xiang Yin Zeng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 1220 days.

(21) Appl. No.: 11/323,339

(22) Filed: Dec. 30, 2005

(65) Prior Publication Data
US 2007/0152796 A1 Jul. 5, 2007

(51) Int. Cl.
*H01F 27/28* (2006.01)
(52) U.S. Cl. .................. 336/223; 438/238; 438/623; 438/706
(58) Field of Classification Search .................. 336/223
See application file for complete search history.

(56) References Cited

U.S. PATENT DOCUMENTS

| | | | |
|---|---|---|---|
| 6,180,445 B1 | 1/2001 | Tsai | |
| 6,218,729 B1 | 4/2001 | Zavrel, Jr. et al. | |
| 6,303,423 B1 | 10/2001 | Lin | |
| 6,377,464 B1 | 4/2002 | Hashemi et al. | |
| 2006/0270065 A1 | 11/2006 | Muthukumar et al. | |

OTHER PUBLICATIONS

Chomnawang, N., et al., "Micromachined on-Chip 3D Inductors", *IEEE Emerging Telecommunication Technologies Conference*, (Richardson, TX), (2002), 4 pgs.

Chomnawang, N., et al., "On-Chip Dome-Shape Spiral Micro-Inductor for High-Frequency Applications", *Proceedings of SPIE—vol. 4700—Smart Structures and Materials 2002*, (Jul. 2002), 50-57.

Chomnawang, N., et al., "Surface Micromachined Arch-Shape on-Chip 3-D Solenoid Inductors for High-Frequency Applications", *Journal of Microlithography, Microfabrication, and Microsystems*, 2(4), (Oct. 2003), 275-281.

Chomnawang, N., et al., "On-Chip 3D Air-Core Microinductor for High-Frequency Applications Using Deformation of Sacrificial Polymer", *Proceedings of SPIE—vol. 4334—Smart Structures and Materials 2001*, (Aug. 2001), 54-62.

Crawford, A. M., et al., "High-Frequency Microinductors With Amorphous Magnetic Ground Planes", *IEEE Transactions on Magnetics, 38(5)*, (Sep. 2002), 3168-3170.

Gardner, D., "High Frequency (GHz) and Low Resistance Integrated Inductors Using Magnetic Materials", *Proceedings of the IEEE 2001 International Interconnect Technology Conference*, (Jun. 2001), 101-103.

O'Donnell, T., et al., "Microtransformers and Inductors Using Permalloy Thin Films", *Preparation, Properties, and Applications of Thin Ferromagnetic Films*, (Jun. 2000), 45-52.

*Primary Examiner*—Elvin G Enad
*Assistant Examiner*—Joselito Baisa
(74) *Attorney, Agent, or Firm*—John N. Greaves (57) ABSTRACT

A spiral inductor is disposed above a substrate that includes two different materials. A dielectric film is the first material that provides structural integrity for the substrate. A second dielectric is the second material that provides a low dielectric-constant (low-K) material closest to the spiral inductor coil. A process of forming the spiral inductor includes patterning the substrate to allow a recess as a receptacle for the second dielectric, followed by forming the spiral inductor mostly above the second dielectric.

22 Claims, 7 Drawing Sheets

FIG. 12

PACKAGED SPIRAL INDUCTOR STRUCTURES, PROCESSES OF MAKING SAME, AND SYSTEMS CONTAINING SAME

TECHNICAL FIELD

Embodiments relate generally to spiral inductors.

TECHNICAL BACKGROUND

High performance and small form-factor passive devices such as capacitors, inductors, and resistors are of increasing importance in integrated circuit (IC) chip packages. For inductors of the planar, spiral configuration, the self-resonance frequency (SRF) of the inductor can limit the performance of the electronic device it is coupled to. Quality Factor, Q, is the commonly accepted indicator of inductor performance in an IC. Q is a measure of the relationship between power loss and energy storage in an inductor. A planar spiral inductor typically experiences losses due to coupling, cross talk noise, resistance, and parasitic capacitance among others. Consequently, a reduced inductance and lowering of Q values occurs.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. These drawings depict typical embodiments that are not necessarily drawn to scale and are not therefore to be considered to be limiting of its scope. The embodiments will be described and explained with additional specificity and detail through the use of the accompanying drawings in which.

DETAILED DESCRIPTION

Embodiments in this disclosure relate to spiral inductors. An embodiment includes a spiral inductor that is supported by a low-k dielectric material.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

Figure 1:
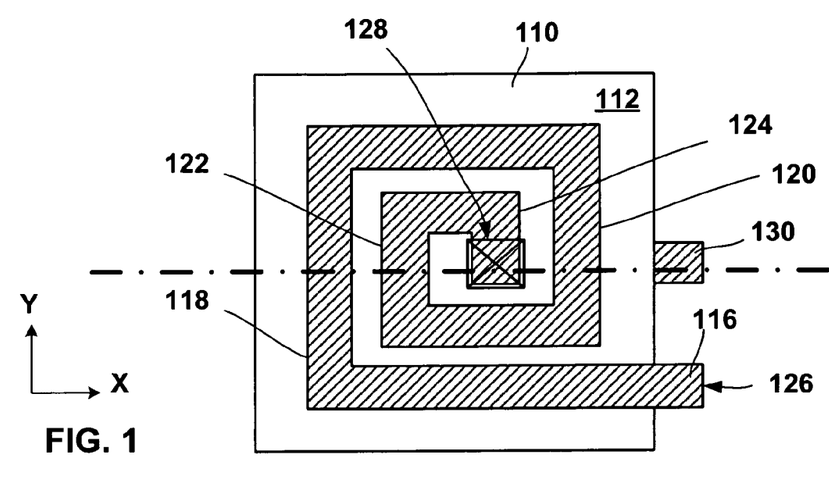
FIG. 1 is a top plan of a spiral inductor according to an embodiment.
Figure 2:
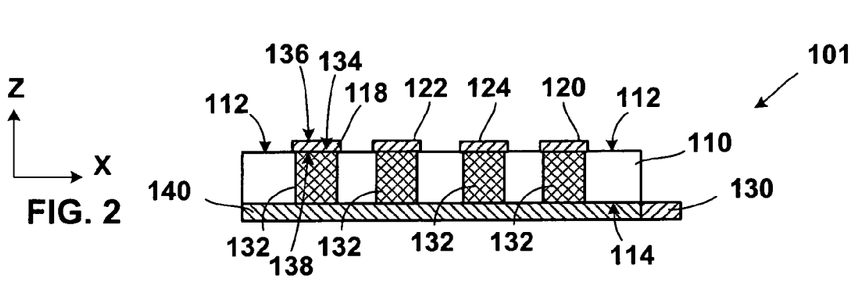
FIG. 2 is a cross-section elevation of the spiral inductor depicted in FIG. 1 according to an embodiment.

FIG. 1 is a top plan of a spiral inductor 100 according to an embodiment. The spiral inductor 100 as depicted includes a film first dielectric 110 with a first dielectric first surface 112 and a first dielectric second surface 114 (FIG. 2). The film first dielectric 110 has a first dielectric constant. In an embodiment, the film first dielectric is a packaging material such as an epoxy that is used for the manufacture of printed wiring boards.

The spiral inductor 100 also includes a spiral inductor first electrode 116, which in FIG. 1 is depicted as a right-hand coil. In the embodiment depicted, the spiral inductor has seven direction-turned segments after the first segment, which reference numeral 116 touches. Other degrees of turning a spiral inductor embodiment, whether more than that depicted in FIG. 1 or less, will depend upon specific application needs. Portions of the spiral inductor first electrode 116 are selectively delineated as a first turn portion 118, a third turn portion 120, a fifth turn portion 122, and a seventh turn portion 124.

Other portions of the spiral inductor first electrode 116 include a first terminal 126 and a second terminal 128. The second terminal 128 is also designated at a location of a via 128 for pinning out the second terminal 128 to a trace 130. Accordingly, a via 128 in this position is coupled and directly connected to the second terminal 128.

FIG. 2 is a cross-section elevation of the spiral inductor depicted in FIG. 1 according to an embodiment. In FIG. 2, the spiral inductor 101 has been depicted at the cross-section line taken in FIG. 1. A second dielectric 132 is shown in a position such that the spiral inductor first electrode 116, depicted as the first turn portion 118, the third turn portion 120, the fifth turn portion 122, and the seventh turn portion 124, is disposed above a second dielectric 132. The second dielectric 132 has a second dielectric constant that is lesser than that of the film first dielectric 110. The second dielectric 132 includes a second dielectric boundary 134 that is substantially coplanar with the first dielectric first surface 112. As can be seen in FIG. 2, the spiral inductor first electrode occurs more directly above the second dielectric 132 than the film first dielectric 110. Accordingly for all embodiments set forth in this disclosure, a spiral inductor first electrode will occur more directly above the second dielectric than the film first dielectric.

In an embodiment, the second dielectric 132 is a gas. In an embodiment, the second dielectric 132 includes air. In an embodiment, the second dielectric 132 includes nitrogen. In an embodiment, the second dielectric 132 includes oxygen. In an embodiment, the second dielectric 132 includes argon. In an embodiment, the second dielectric 132 includes a gas that is inert to the materials of the film first dielectric 110 and the spiral coil first electrode 116. In an embodiment, the second dielectric 132 is an organic solid such as a low-K dielectric material. In an embodiment, the second dielectric 132 is an inorganic solid.

In an embodiment, the spiral inductor first electrode has a first electrode first surface 136 and a first electrode second surface 138 that is parallel-planar with the first surface 136. As depicted in FIG. 2, the first electrode second surface 138 is effectively at the second dielectric boundary 134. Where the second dielectric 132 is a gas, the electrode second surface 138 is the second dielectric boundary 134.

A ground film 140 is also depicted in FIG. 2. The trace 130 is also depicted, but as further disclosed, the trace 130 is not contact with the ground film 140 according to an embodiment.

Figure 3:
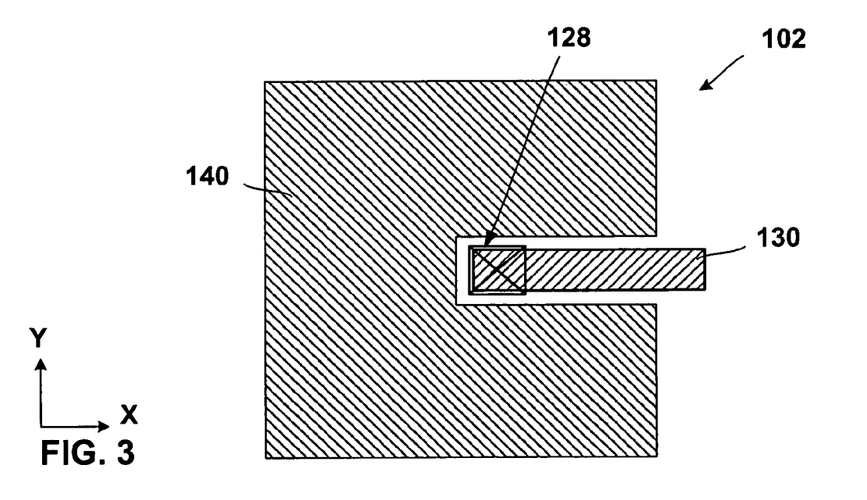
FIG. 3 is a top plan that exposes the ground film and the trace in the spiral inductor depicted in FIGS. 1 and 2 according to an embodiment.

FIG. 3 is a top plan that exposes the ground film 140 and the trace 130 in the spiral inductor depicted in FIGS. 1 and 2 according to an embodiment. In FIG. 3, the spiral inductor 102 illustrates the ground film 140 with the film first dielectric 110 (FIG. 1) removed. Also, the trace 130 is depicted as being electrically isolated from the ground film 140. FIG. 3 also illustrates the footprint of the via 128, which corresponds vertically (in the Z-axis direction in FIG. 2) with the location of the second terminal 128 of the spiral inductor first electrode 116 depicted in FIG. 1. The via 128 has not been formed, however, for clarity of illustration, but it is understood that the via 128 is directly connected to the seventh turn portion 124 and to the trace 130.

Figure 4:
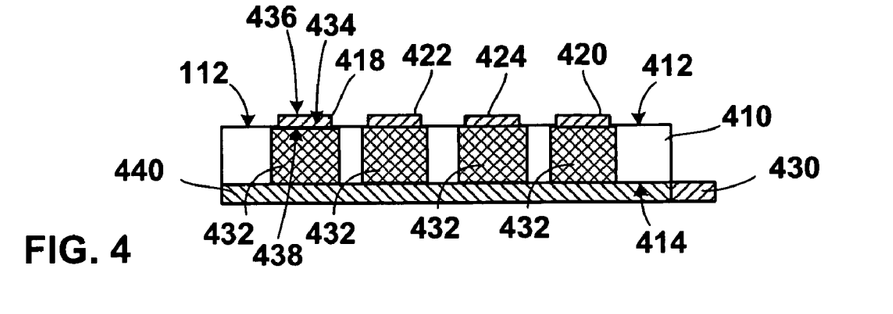
FIG. 4 is a cross-section elevation of a spiral inductor according to an embodiment.

FIG. 4 is a cross-section elevation of a spiral inductor 400 according to an embodiment. The spiral inductor 400 as depicted includes a film first dielectric 410 with a first dielectric first surface 412 and a first dielectric second surface 414. The film first dielectric 410 has a first dielectric constant. The spiral inductor 400 also includes a spiral inductor first electrode that is depicted as portions thereof similar to the spiral inductor first electrode 116 in FIG. 2. The illustrated portions of the spiral inductor first electrode are selectively delineated as a first turn portion 418, a third turn portion 420, a fifth turn portion 422, and a seventh turn portion 424.

A second dielectric 432 is shown in a position such that the spiral inductor first electrode, depicted as the first turn portion 418, third turn portion 420, fifth turn portion 422, a seventh turn portion 424, is entirely supported by the second dielectric 432. The second dielectric 432 has a second dielectric constant that is smaller than the dielectric constant of the film first dielectric 410. The second dielectric 432 includes a second dielectric boundary 434 that is substantially coplanar with the first dielectric first surface 412.

In an embodiment, the spiral inductor first electrode has a first electrode first surface 436 and a first electrode second surface 438 that is parallel-planar with the first surface 436. As depicted in FIG. 4, the electrode second surface 438 is effectively at the second dielectric boundary 434. A ground film 440 is also depicted in FIG. 4. The trace 430 is also depicted, but the trace 430 is not contact with the ground film 440 according to an embodiment.

Figure 5:
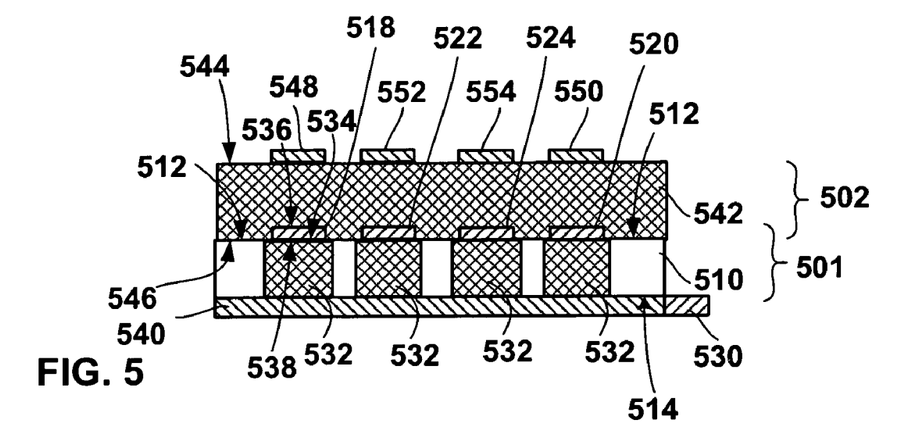
FIG. 5 is a cross-section elevation of a spiral inductor stack according to an embodiment.

FIG. 5 is a cross-section elevation of a spiral inductor stack 500 according to an embodiment. The spiral inductor stack 500 includes a first spiral inductor section 501 and a second spiral inductor section 502. A ground film 540 is also depicted in FIG. 5. The trace 530 is also depicted, but the trace 530 is not contact with the ground film 540 according to an embodiment. A via connects the trace 530 with the seventh turn portion 524 and the seventh turn portion 554 in a manner similar to connection of the via 218 in FIG. 1 connects the seventh turn portion 124 to the trace 130.

The first spiral inductor section 501 is essentially the same construction as the spiral inductor 400 depicted in FIG. 4. According to an embodiment, the first spiral inductor section 501 is replaced with a structure such as the spiral inductor 101 depicted in FIG. 2. Accordingly as depicted, the first spiral inductor section 501 includes a film first dielectric 510 with a first dielectric first surface 512 and a first dielectric second surface 514. The film first dielectric 510 has a first dielectric constant. The first spiral inductor section 501 also includes a spiral inductor first electrode that is depicted as portions thereof similar to the spiral inductor first electrode 116 in FIG. 1. The illustrated portions of the spiral inductor first electrode are selectively delineated as a first turn portion 518, a third turn portion 520, a fifth turn portion 522, and a seventh turn portion 524.

A second dielectric 532 is shown in a position such that the spiral inductor first electrode, depicted as the first turn portion 518, third turn portion 520, fifth turn portion 522, and seventh turn portion 524, is entirely supported by the second dielectric 532. The second dielectric 532 has a second dielectric constant that is smaller than the dielectric constant of the film first dielectric 510. The second dielectric 532 includes a second dielectric boundary 534 that is substantially coplanar with the first dielectric first surface 512.

In an embodiment, the spiral inductor first electrode has a first electrode first surface 536 and a first electrode second surface 538 that is parallel-planar with the first electrode first surface 536. As depicted in FIG. 5, the first electrode second surface 538 is effectively at the second dielectric boundary 534.

The second spiral inductor section 502 uses the first spiral inductor section 501 as a support substrate. Accordingly as depicted, the second spiral inductor section 502 includes an upper dielectric film 542 with an upper dielectric first surface 544 and an upper dielectric second surface 546. The second spiral inductor section 502 also includes a spiral inductor second electrode that is depicted as portions thereof similar to the spiral inductor first electrode, which is depicted in selected sections within the first spiral inductor section 501. The illustrated portions of the spiral inductor second electrode are selectively delineated as a first turn portion 548, a third turn portion 550, a fifth turn portion 552, and a seventh turn portion 554.

In an embodiment, the upper dielectric 542 is also a low-K dielectric such as the second dielectric 532. The second dielectric 532 is shown in a position such that the spiral inductor second electrode, depicted as the first turn portion 548, third turn portion 550, fifth turn portion 552, and seventh turn portion 554, is entirely supported by the upper dielectric 542.

Figure 6:
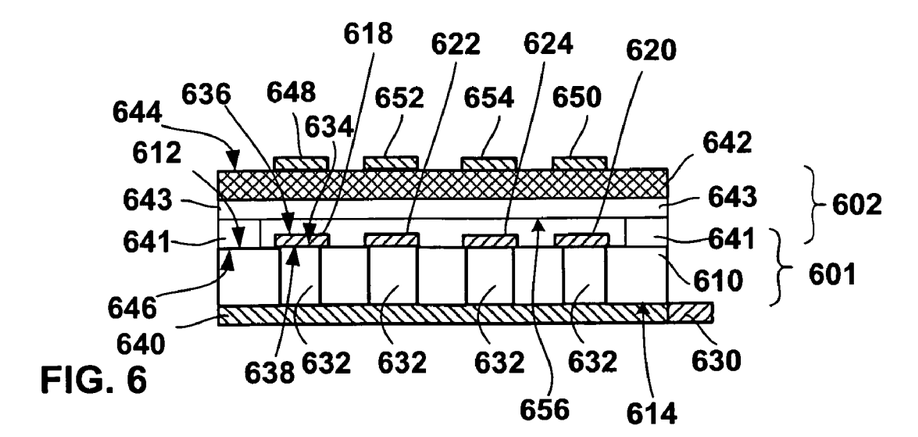
FIG. 6 is a cross-section elevation of a spiral inductor stack according to an embodiment.

FIG. 6 is a cross-section elevation of a spiral inductor stack 600 according to an embodiment. The spiral inductor stack 600 includes a first spiral inductor section 601 and a second spiral inductor section 602. A ground film 640 is also depicted in FIG. 6. The trace 630 is also depicted, but the trace 630 is not contact with the ground film 640 according to an embodiment.

The first spiral inductor section 601 is essentially the same construction as the spiral inductor 400 depicted in FIG. 4, with the embodiment of the second dielectric 632 being a gas. Accordingly as depicted, the first spiral inductor section 601 includes a film first dielectric 610 with a first dielectric first surface 612 and a first dielectric second surface 614. The film first dielectric 610 has a first dielectric constant. The first spiral inductor section 601 also includes a spiral inductor first electrode that is depicted as portions thereof similar to the spiral inductor first electrode 116 in FIG. 1. The illustrated portions of the spiral inductor first electrode are selectively delineated as a first turn portion 618, a third turn portion 620, a fifth turn portion 622, and a seventh turn portion 624.

The second dielectric 632 is shown in a position such that the spiral inductor first electrode, depicted as the first turn portion 618, the third turn portion 620, the fifth turn portion 622, and the seventh turn portion 624, is entirely supported by the film first dielectric 610 because the second dielectric is a gas. The second dielectric 632 includes a second dielectric boundary 634 that is substantially coplanar with and defined by the first dielectric first surface 612.

In an embodiment, the spiral inductor first electrode has a first electrode first surface 636 and a first electrode second surface 638 that is parallel-planar with the first electrode first surface 636. As depicted in FIG. 6, the first electrode second surface 638 is effectively at the second dielectric boundary 634.

The second spiral inductor section 602 uses the first spiral inductor section 601 as a support substrate. Accordingly as depicted, the second spiral inductor section 602 includes an upper dielectric film 642 with an upper dielectric first surface 644 and an upper dielectric second surface 646. The upper dielectric film 642 is supported by an upper support 643 that is placed onto the base 641, such as a B-staged adhesive and in which the upper support is relatively rigid. The base 641 and upper support leave a gas gap 656 to isolate the spiral inductor first electrode in the first spiral inductor section 601. Accordingly, the spiral inductor first electrode is virtually surrounded by a dielectric gas environment that includes the second dielectric 632 and the gas gap 656 that acts as an upper dielectric 656.

The second spiral inductor section 602 also includes a spiral inductor second electrode that is depicted as portions thereof similar to the spiral inductor first electrode, which is depicted in selected sections within the first spiral inductor section 601. The illustrated portions of the spiral inductor second electrode are selectively delineated as a first turn portion 648, a third turn portion 650, a fifth turn portion 652, and a seventh turn portion 654. A via connects the trace 630 with the seventh turn portion 624 and the seventh turn portion 654 in a manner similar to connection of the via 218 in FIG. 1 connects the seventh turn portion 124 to the trace 130.

Figure 7A:
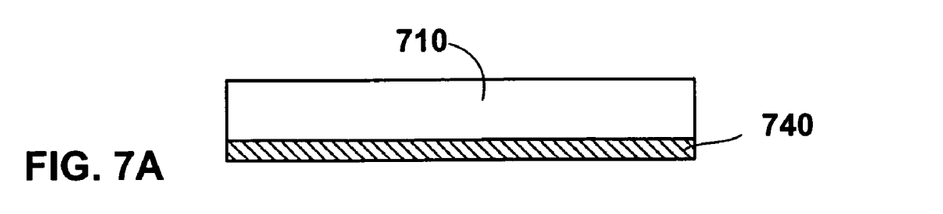
FIG. 7A is a cross-section elevation of a spiral inductor during processing according to an embodiment.

FIG. 7A is a cross-section elevation of a spiral inductor 700 during processing according to an embodiment. In this embodiment, the spiral inductor 700 is manufactured with a gas such as air as the second dielectric. A ground film 740 and a film first dielectric 710 are laminated according to an embodiment.

Figure 7B:
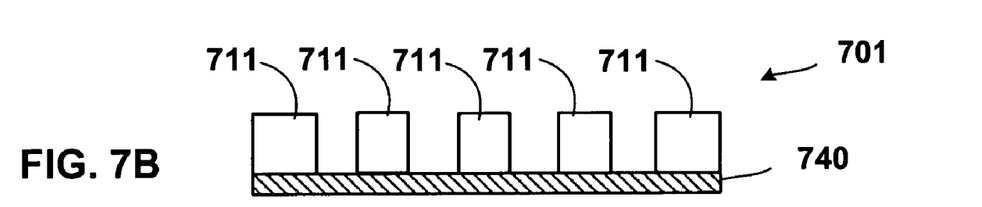
FIG. 7B is a cross-section elevation of the spiral inductor depicted in FIG. 7A after further processing according to an embodiment.

FIG. 7B is a cross-section elevation of the spiral inductor depicted in FIG. 7A after further processing according to an embodiment. The spiral inductor 701 has been processed to pattern the film first dielectric 711. In an embodiment, the film first dielectric 710, depicted in FIG. 7A, is a green-stage polymer that is imprinted and cured to achieve the film first dielectric 711 depicted in FIG. 7B. In an embodiment, the film first dielectric 710, depicted in FIG. 7A, is etched to achieve the film first dielectric 711 depicted in FIG. 7B. In any event, a recess is formed by the patterning the film first dielectric 711. In an embodiment, the process of first imprinting is followed by second etching. The second etching is used to scrub any residue from with the recess that has been formed; particularly the residue may be scrubbed from the recess bottom, near the location of the ground film 740. The recess is the receptacle for the second dielectric 732 (FIG. 7D).

Figure 7C:
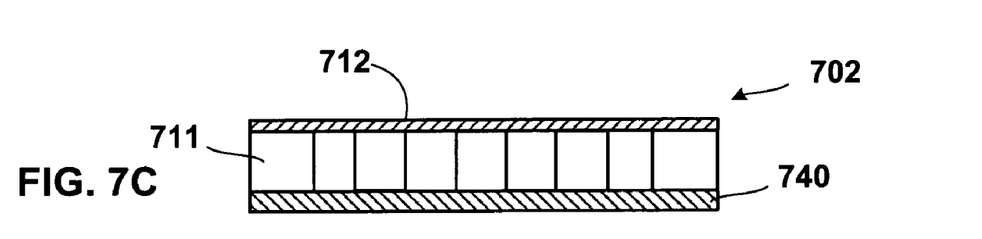
FIG. 7C is a cross-section elevation of the spiral inductor depicted in FIG. 7B after further processing according to an embodiment.

FIG. 7C is a cross-section elevation of the spiral inductor depicted in FIG. 7B after further processing according to an embodiment. The spiral inductor 702 has been processed by locating an electrode first foil 712 over the film first dielectric 711.

Figure 7D:
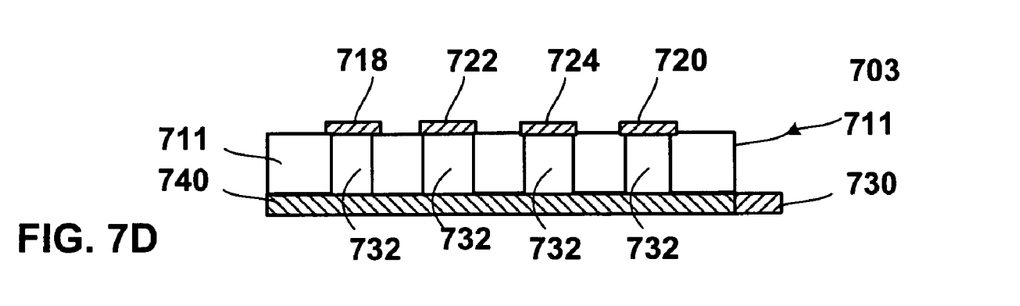
FIG. 7D is a cross-section elevation of the spiral inductor depicted in FIG. 7C after further processing according to an embodiment.

FIG. 7D is a cross-section elevation of the spiral inductor depicted in FIG. 7C after further processing according to an embodiment.

In an embodiment, the spiral inductor 703 has been processed to receive a trace 730 that is useful to connect the spiral inductor at one terminal thereof. The spiral inductor 703 is also illustrated with a patterned spiral inductor first electrode, which is a spiral inductor first electrode such as the spiral inductor first electrode 116 depicted in FIG. 1. Accordingly, the spiral inductor first electrode is depicted in cross section as a first turn portion 718, a third turn portion 720, a fifth turn portion 722, and a seventh turn portion 724. The spiral inductor 703 therefore includes a second dielectric 732 that is a gas.

Figure 8A:
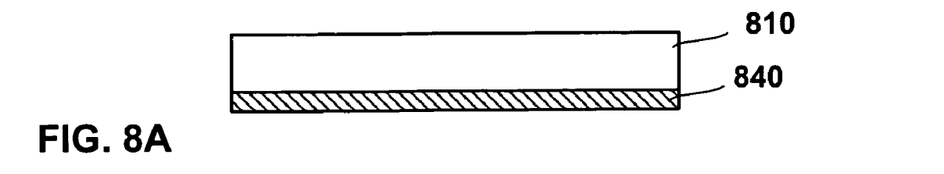
FIG. 8A is a cross-section elevation of a spiral inductor during processing according to an embodiment.

FIG. 8A is a cross-section elevation of a spiral inductor 800 during processing according to an embodiment. In this embodiment, the spiral inductor 800 is manufactured with a solid such as an organic or inorganic material as the second dielectric. A ground film 840 and a film first dielectric 810 are laminated according to an embodiment.

Figure 8B:
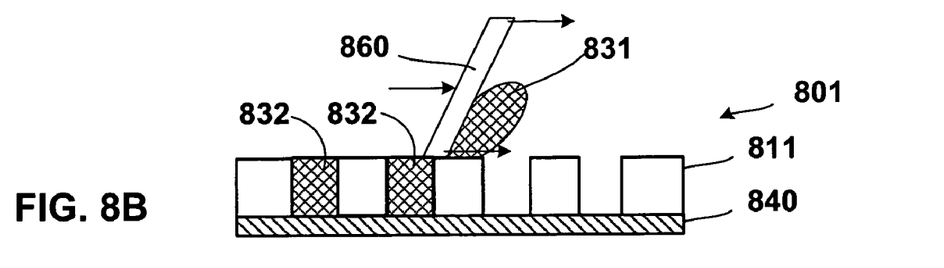
FIG. 8B is a cross-section elevation of the spiral inductor depicted in FIG. 8A after further processing according to an embodiment.

FIG. 8B is a cross-section elevation of the spiral inductor depicted in FIG. 8A after further processing according to an embodiment. The spiral inductor 801 has been processed to pattern the film first dielectric 811. In an embodiment, the film first dielectric 810, depicted in FIG. 8A, is a green-stage polymer that is imprinted and cured to achieve the film first dielectric 811 depicted in FIG. 8B. In an embodiment, the film first dielectric 810, depicted in FIG. 8A, is etched to achieve the film first dielectric 811 depicted in FIG. 8B.

In an embodiment, the imprinted or etched film first dielectric 811 is back-filled with a second dielectric 831, which can be a green-stage organic dielectric, to achieve the second dielectric 832 that is designed to be next to the spiral inductor electrode. In an embodiment, back-filling the second dielectric 831 is done by using a doctor blade 860 or the like.

Figure 8C:
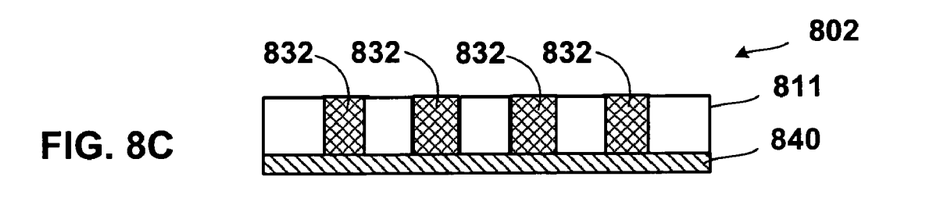
FIG. 8C is a cross-section elevation of the spiral inductor depicted in FIG. 8B after further processing according to an embodiment.

FIG. 8C is a cross-section elevation of the spiral inductor depicted in FIG. 8B after further processing according to an embodiment. In an embodiment, the spiral inductor 802 has been processed such as if the second dielectric 832 is a green organic paste, then curing is carried out to solidify and stabilize the spiral inductor 802.

Figure 8D:
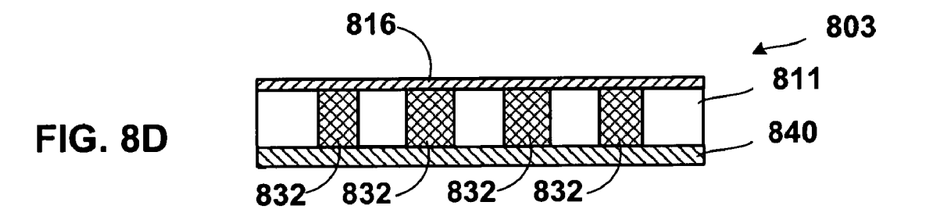
FIG. 8D is a cross-section elevation of the spiral inductor depicted in FIG. 8C after further processing according to an embodiment.

FIG. 8D is a cross-section elevation of the spiral inductor depicted in FIG. 8C after further processing according to an embodiment. The spiral inductor 803 has been processed by locating an electrode first foil 816 over the film first dielectric 811.

Figure 8E:
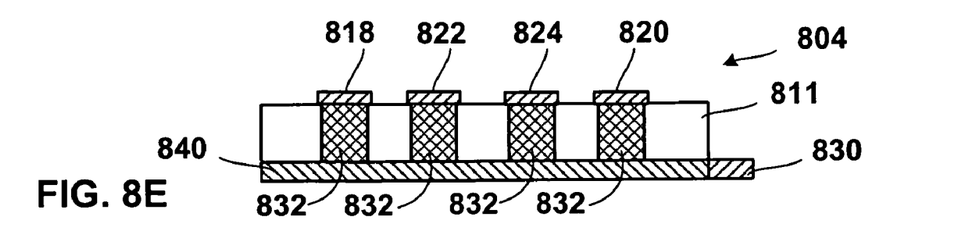
FIG. 8E is a cross-section elevation of the spiral inductor depicted in FIG. 8D after further processing according to an embodiment.

FIG. 8E is a cross-section elevation of the spiral inductor depicted in FIG. 8D after further processing according to an embodiment. In an embodiment, the spiral inductor 804 has been processed to receive a trace 830 that is useful to connect the spiral inductor 804 at one terminal thereof. The spiral inductor 804 is also illustrated with a patterned spiral inductor first electrode, which is a spiral inductor first electrode such as the spiral inductor first electrode 116 depicted in FIG. 1. Accordingly, the spiral inductor first electrode is depicted in cross section as a first turn portion 818, a third turn portion 820, a fifth turn portion 822, and a seventh turn portion 824. The spiral inductor 804 therefore includes a second dielectric 832 that is a solid.

Figure 9:
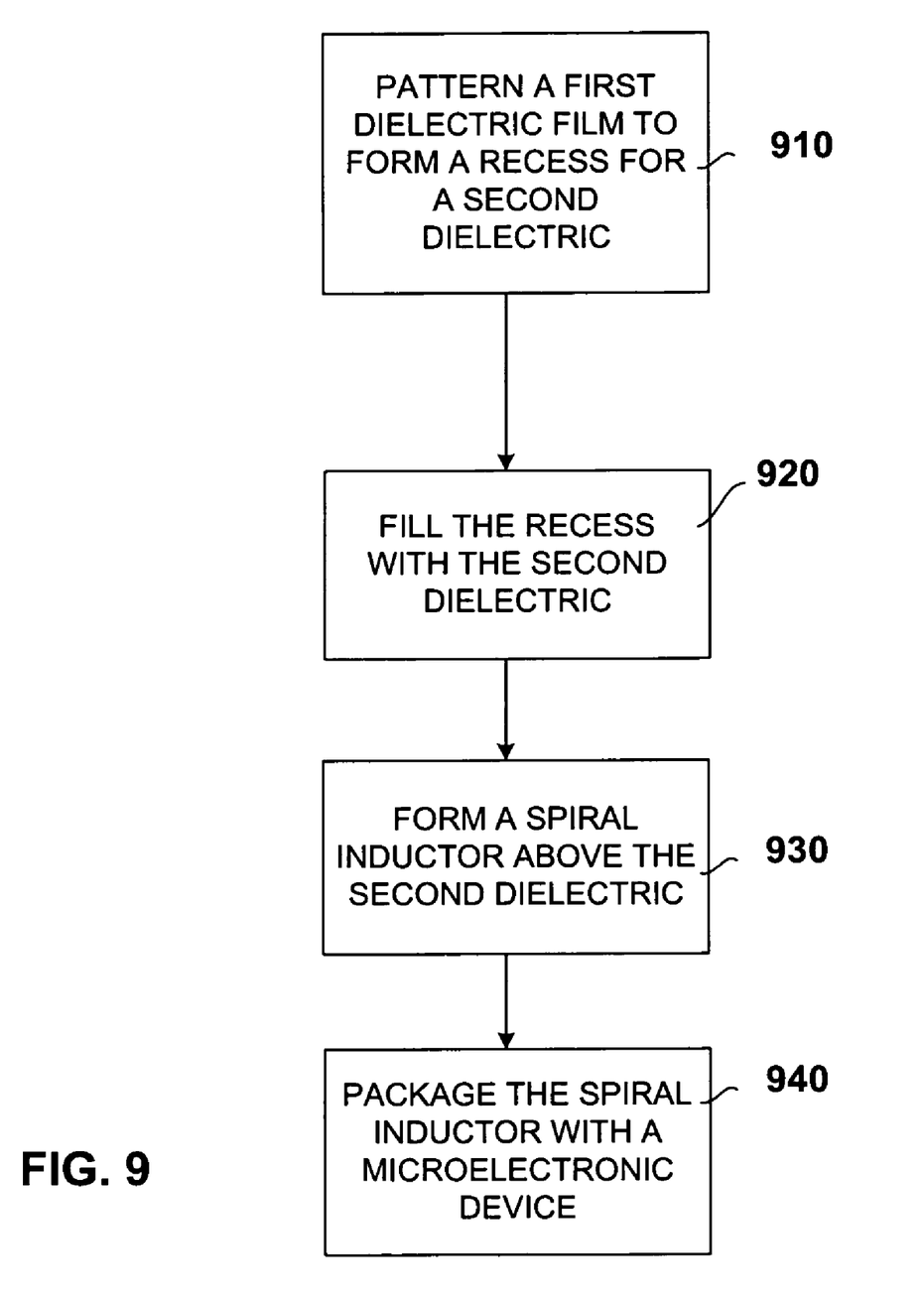
FIG. 9 is a flow chart that describes process and method flow embodiments.

FIG. 9 is a flow chart 900 that describes process and method flow embodiments.

At 910, the process includes patterning a film first dielectric to provide recesses for the second dielectric.

At 920, the process includes filling the provided recesses with the second dielectric. In an embodiment, filling is autogenously done where the second dielectric is a gas.

At 930, the process includes forming the spiral inductor first electrode above the film first dielectric and the second dielectric. In an embodiment, the process includes laminating a foil and etching the foil to achieve the spiral electrode. In an embodiment, the process commences at 910 and terminates at 930. In an embodiment, the process commences at 930 and also terminates at 930.

Figure 10:
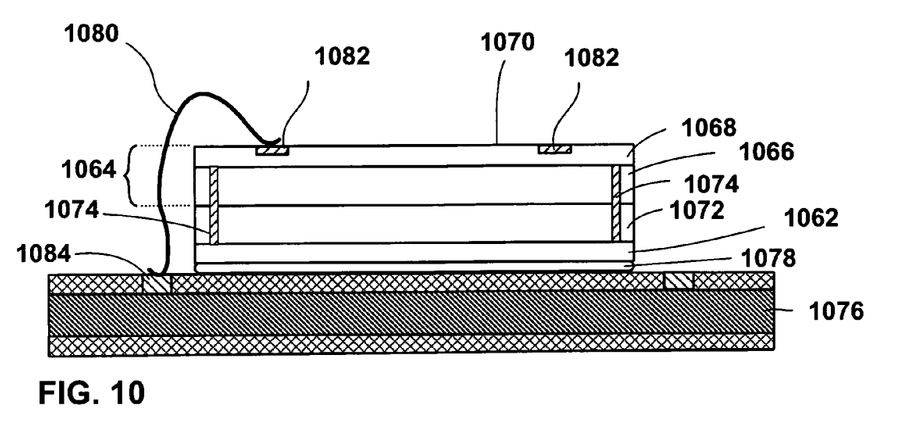
FIG. 10 is a cross-section elevation of a packaged spiral inductor according to an embodiment.

At 940, a method includes packaging the spiral inductor. In an embodiment, packaging the spiral inductor includes packaging it with a microelectronic device. Such a package is depicted in FIG. 10. In an embodiment, the process commences at 910 and terminates with the method at 940. In an embodiment, the method commences at 940 and also terminates at 940.

FIG. 10 is a cross-section elevation of a packaged spiral inductor 1062 in a chip package 1000 according to an embodiment. As depicted in FIG. 10, the spiral inductor is seen in elevational side view similar to the X-Z orientation of the spiral inductor 101 depicted in the In FIG. 2. In an embodiment, a die 1064 is provided that includes a semiconductive substrate 1066 and active-device circuitry 1068 on an active surface 1070. A dielectric layer 1072 is disposed below the die 1064. The spiral inductor 1062 is disposed below the dielectric layer 1072. The spiral inductor 1062 is coupled to the die 1064 through an interconnect 1074. The die 1064 is adhered to a mounting substrate 1076 according to an embodiment. In an embodiment, the die 1064 is adhered to the mounting substrate 1076 with an adhesive 1078 such as a die-attach adhesive that is known.

Electrical signal and power communication is carried out between the die 1064 and the mounting substrate 1076 by a series of bond wires, one of which is depicted with the reference numeral 1080 according to an embodiment. The bond wire 1080 communicates between the die 1064 and the mounting substrate 1076 by use of the die bond pads 1082 and mounting substrate bond pads, one of which is designated by reference numeral 1084.

Figure 11:
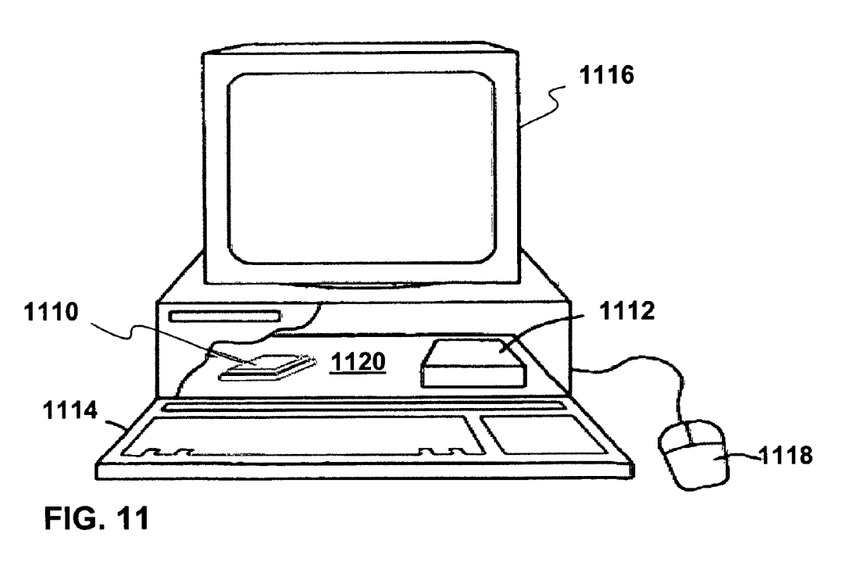
FIG. 11 is a cut-away elevation that depicts a computing system according to an embodiment.

FIG. 11 is a cut-away elevation that depicts a computing system according to an embodiment. One or more of the foregoing embodiments of the spiral inductor may be utilized in a computing system, such as a computing system 1100 of FIG. 11. Hereinafter any spiral inductor device embodiment alone or in combination with any other embodiment is referred to as an embodiment(s) configuration.

The computing system 1100 includes at least one processor (not pictured), which is enclosed in an IC chip package 1110, and a data storage system 1112 such as dynamic random-access memory. In an embodiment, the processor is the die 1064 as depicted in FIG. 10. The computing system 1100 also includes at least one input device such as a keyboard 1114, and at least one output device such as a monitor 1116, for example. The computing system 1100 includes a processor that processes data signals, and may include, for example, a microprocessor, available from Intel Corporation. In addition to the keyboard 1114, the computing system 1100 can include another user input device such as a mouse 1118, for example. The computing system 1100 can include a structure, after processing as depicted in FIGS. 1-8 and 10 as the given spiral inductor device embodiment.

For purposes of this disclosure, a computing system 1100 embodying components in accordance with the claimed subject matter may include any system that utilizes a microelectronic device system, which may include, for example, at least one of the spiral inductor device embodiments that is coupled to data storage such as dynamic random access memory (DRAM) 1112, or polymer memory 1112, or flash memory 1112, or phase-change memory 1112. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die such as the processor in the chip package 1110. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 1112.

In an embodiment, the computing system 1100 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 1120. In this embodiment, an embodiment(s) configuration is coupled to the DSP, and a separate embodiment(s) configuration may be present that is coupled to the processor in the IC chip package 1110. Additionally in an embodiment, an embodiment(s) configuration is coupled to a DSP that is mounted on the same board 1120 as the IC chip package 1110. It can now be appreciated that the embodiment(s) configuration can be combined as set forth with respect to the computing system 1100, in combination with an embodiment(s) configuration as set forth by the various embodiments of the spiral inductor device within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

Figure 12:
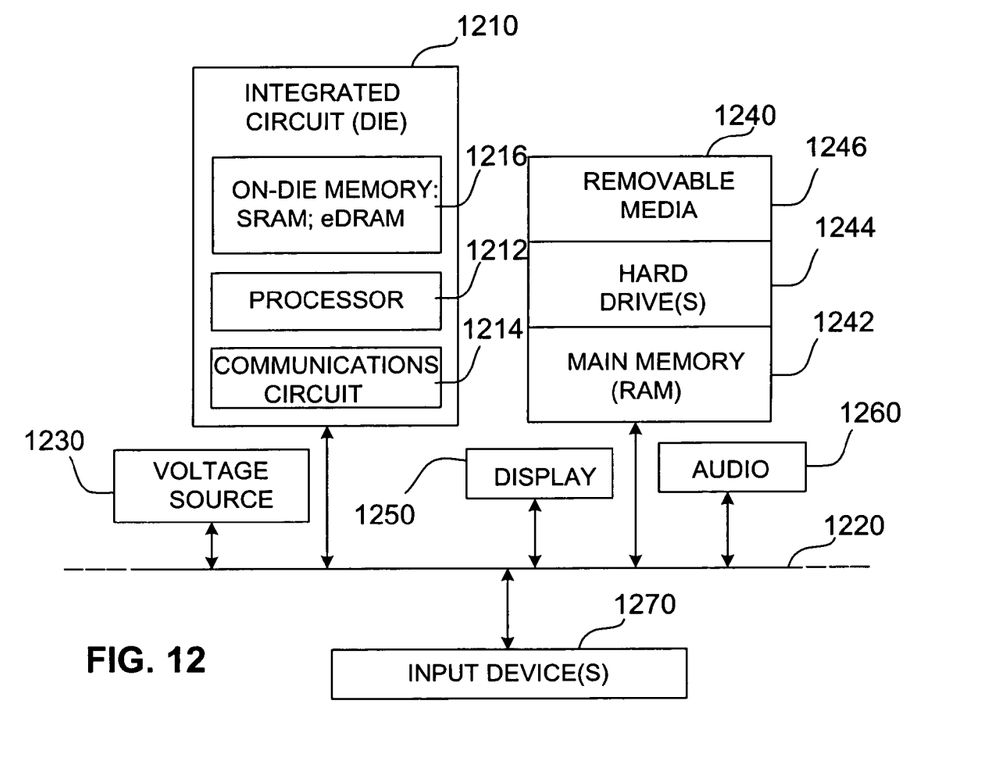
FIG. 12 is a schematic of a computing system according to an embodiment.

FIG. 12 is a schematic of a computing system according to an embodiment. The electronic system 1200 as depicted can embody the computing system 1100 depicted in FIG. 11, but the electronic system is depicted more generically and includes the spiral inductor embodiment for at least one component. The electronic system 1200 incorporates at least one electronic assembly 1210, such as an IC die illustrated in FIG. 10. In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 means any type of circuit such as, but not limited to, a microprocessor, a microcontroller, a graphics processor, a digital signal processor, or another processor. Other types of circuits that can be included in the integrated circuit 1210 are a custom circuit or an ASIC, such as a communications circuit 1214 for use in wireless devices such as cellular telephones, pagers, portable computers, two-way radios, and similar electronic systems. In an embodiment, the processor 1210 includes on-die memory 1216 such as SRAM. In an embodiment, the processor 1210 includes on-die memory 1216 such as eDRAM.

In an embodiment, the electronic system 1200 also includes an external memory 1240 that in turn may include one or more memory elements suitable to the particular application, such as a main memory 1242 in the form of RAM, one or more hard drives 1226, and/or one or more drives that handle removable media 1248, such as diskettes, compact disks (CDs), digital video disks (DVDs), flash memory keys, and other removable media known in the art.

In an embodiment, the electronic system 1200 also includes a display device 1250, an audio output 1260. In an embodiment, the electronic system 1200 includes a controller 1270, such as a keyboard, mouse, trackball, game controller, microphone, voice-recognition device, or any other device that inputs information into the electronic system 1200.

As shown herein, integrated circuit 1210 can be implemented in a number of different embodiments, including an electronic package, an electronic system, a computer system, one or more methods of fabricating an integrated circuit, and one or more methods of fabricating an electronic assembly that includes the integrated circuit and the spiral inductor as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
a film first dielectric including a first dielectric first surface and a first dielectric second surface, wherein the film first dielectric has a first dielectric constant;
a second dielectric disposed adjacent the film first dielectric, wherein the second dielectric includes a second dielectric boundary that is substantially coplanar with the first dielectric first surface, wherein the second dielectric has a second dielectric constant that is smaller than the first dielectric constant; and
a spiral inductor first electrode disposed above the film first dielectric and the second dielectric, wherein the spiral inductor first electrode includes a first electrode first surface and a first electrode second surface that is parallel planar with the first electrode first surface, and wherein the first electrode second surface is at the second dielectric boundary.

2. The article of claim 1, wherein the spiral inductor first electrode is entirely supported by the second dielectric.

3. The article of claim 1, wherein the spiral inductor first electrode is partially supported by the film first dielectric at the first dielectric first surface.

4. The article of claim 1, wherein the second dielectric is a gas.

5. The article of claim 1, wherein the second dielectric is a gas selected from air, nitrogen, oxygen, argon, a noble gas, and combinations thereof.

6. The article of claim 1, wherein the second dielectric is a solid selected from an organic, an inorganic, and a combination thereof.

7. The article of claim 1, further including a ground film disposed below the first dielectric second surface.

8. The article of claim 1, further including a ground film disposed below the first dielectric second surface, wherein the spiral inductor first electrode includes a first terminal and a second terminal, wherein the second terminal is coupled to a trace disposed coplanar with the ground film.

9. The article of claim 1, further including a spiral inductor second electrode disposed above the spiral inductor first electrode and coupled to the first terminal and the second terminal.

10. A process comprising:
forming a spiral inductor first electrode above a substrate, wherein the substrate includes a patterned film first dielectric and a second dielectric disposed in the patterned film first dielectric, wherein the film first dielectric includes a first dielectric first surface and a first dielectric second surface, wherein the second dielectric is disposed adjacent the film first dielectric, wherein the second dielectric includes a second dielectric boundary that is substantially coplanar with the first dielectric first surface;

wherein the film first dielectric and the second dielectric are below the spiral inductor, and wherein forming the spiral inductor first electrode occurs more directly above the second dielectric than directly above the film first dielectric.

11. The process of claim 10, wherein forming the patterned film first dielectric includes:

forming a recess in the film first dielectric to achieve the patterned film first dielectric, wherein the film first dielectric has a first dielectric constant;

filling the recess with the second dielectric, wherein the second dielectric has a second dielectric constant that is smaller than the first dielectric constant.

12. The process of claim 11, wherein forming the recess is a process selected from imprinting a B-staged polymer as the film first dielectric, imprinting the film first dielectric, etching the film first dielectric, and combinations thereof.

13. The process of claim 11, wherein filling the recess is selected from filling the recess with a gas, a paste, and a solid.

14. The process of claim 10, further including laminating the film first dielectric with a ground film, wherein the film first dielectric includes a first side and a second side, wherein the spiral inductor first electrode is disposed above the first side and the ground film is disposed below the second side.

15. The process of claim 10, further including:

laminating the film first dielectric with a ground film, wherein the film first dielectric includes a first side and a second side, wherein the spiral inductor first electrode is disposed above the first side and the ground film is disposed below the second side; and forming a trace coplanar with the ground film.

16. The process of claim 10, further including packaging the spiral inductor first electrode with a microelectronic device.

17. The process of claim 10, further including forming a spiral inductor second electrode above the spiral inductor first electrode.

18. A system comprising:

a film first dielectric including a first dielectric first surface and a first dielectric second surface, wherein the film first dielectric has a first dielectric constant;

a second dielectric disposed adjacent the film first dielectric, wherein the second dielectric includes a second dielectric boundary that is substantially coplanar with the first dielectric first surface, wherein the second dielectric has a second dielectric constant that is smaller than the first dielectric constant; and a spiral inductor first electrode disposed above the film first dielectric and the second dielectric, wherein the spiral inductor first electrode includes a first electrode first surface and a first electrode second surface that is parallel planar with the electrode first surface, and wherein the electrode second surface is at the second dielectric boundary;

a die coupled to the spiral inductor first electrode; and dynamic random-access memory coupled to the die.

19. The system of claim 18, further including a spiral inductor second electrode disposed above the spiral inductor first electrode.

20. The system of claim 18, wherein the die and the spiral inductor are disposed in a single package.

21. The system of claim 18, wherein the system is disposed in one of a computer, a wireless communicator, a hand-held device, an automobile, a locomotive, an aircraft, a watercraft, and a spacecraft.

22. The system of claim 18, wherein the die is selected from a data storage device, a digital signal processor, a micro controller, an application specific integrated circuit, and a microprocessor.

* * * * *